United States Patent [19]

Kumpitsch et al.

[11] Patent Number: 4,630,881

[45] Date of Patent: Dec. 23, 1986

[54] IMMEDIATELY TESTABLE SUPERCONDUCTOR JOINT

[75] Inventors: Robert C. Kumpitsch, Johnstown; James P. Retersdorf, Gloversvill; Charles W. Lewis, Schenectady, all of N.Y.

[73] Assignee: General Electric Company, Schenectady, N.Y.

[21] Appl. No.: 794,994

[22] Filed: Nov. 4, 1985

[51] Int. Cl.[4] .......................................... H01R 11/01
[52] U.S. Cl. ........................... 339/176 R; 339/12 R
[58] Field of Search ............... 339/12 R, 12 G, 12 L, 339/176 R, 176 M, 191-196

[56] References Cited

U.S. PATENT DOCUMENTS

| | | | |
|---|---|---|---|
| 3,786,391 | 1/1974 | Mathauser | 339/12 R |
| 4,112,941 | 9/1978 | Larimore | 339/12 R |
| 4,317,969 | 3/1982 | Riegler et al. | 339/12 R |
| 4,481,467 | 11/1984 | Alexandersen | 339/12 R |

Primary Examiner—Joseph H. McGlynn
Attorney, Agent, or Firm—William H. Steinberg; James C. Davis, Jr.; Paul R. Webb, II

[57] ABSTRACT

A test loop is included in soldered electrical connections of a superconducting magnet system which allows direct test evaluation of the connection to determine both its persistent current carrying ability, as well as its quench value immediately after it is fabricated. The test loop can be made a permanent part of the connection to allow checking the electrical integrity of the coil connections at any point in the manufacturing cycle of the superconducting magnet system.

4 Claims, 4 Drawing Figures

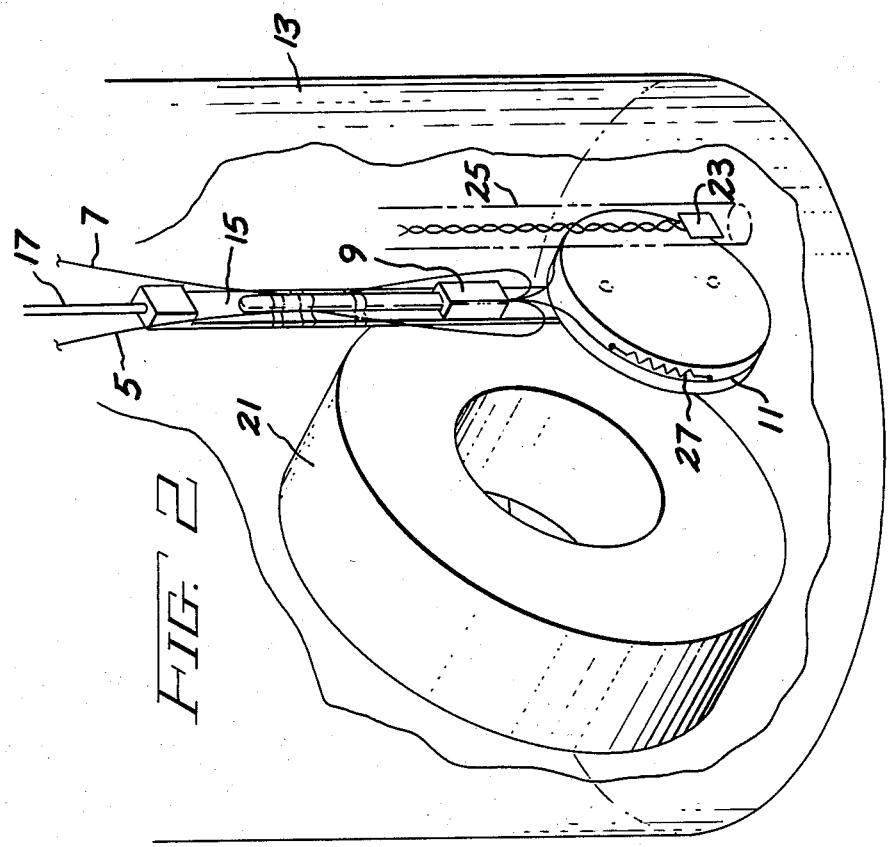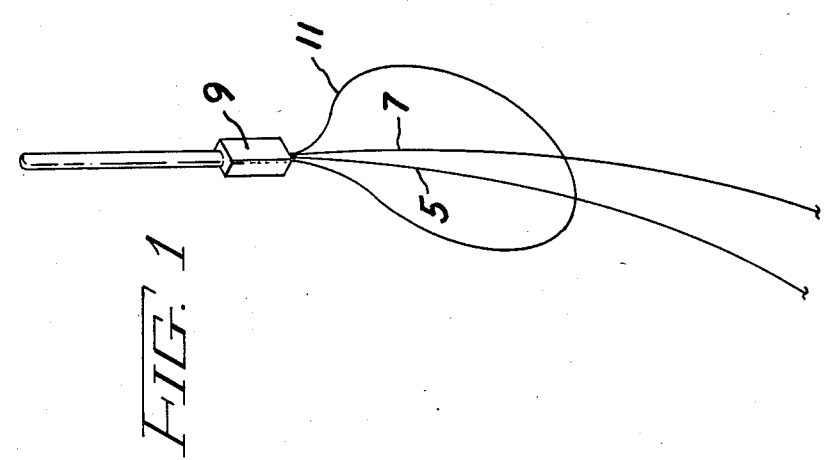

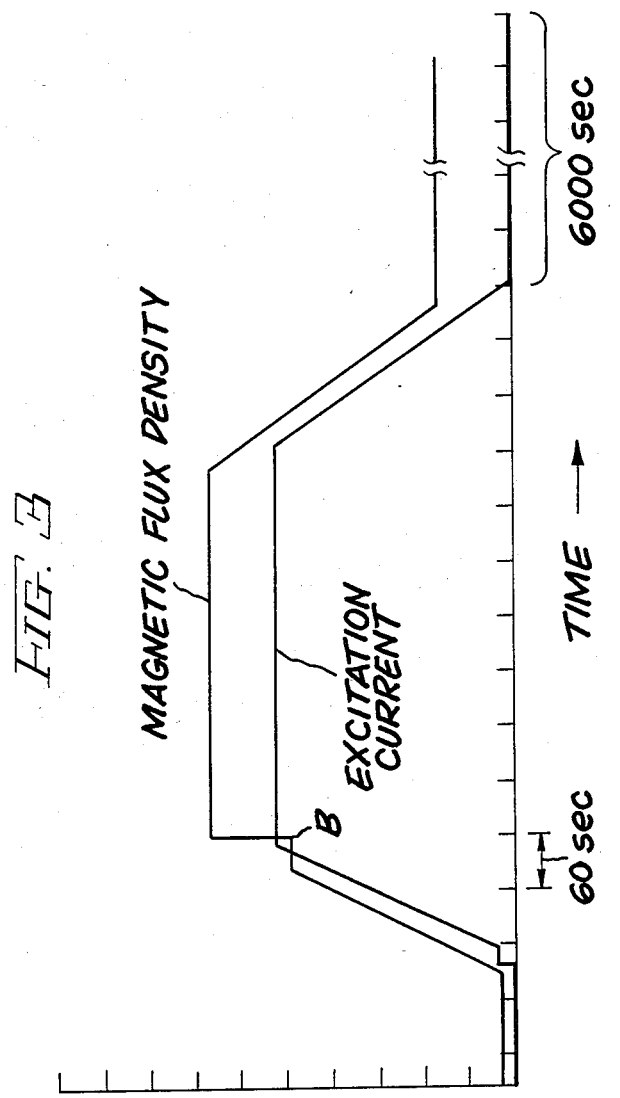

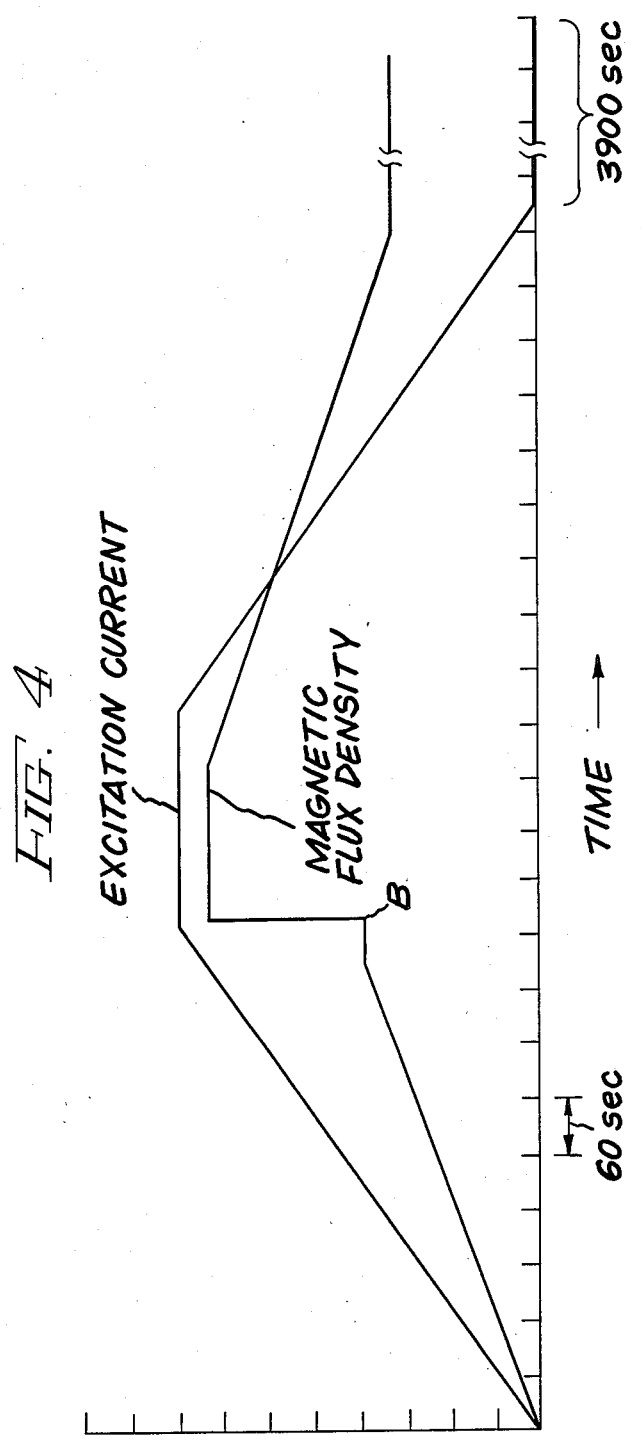

IMMEDIATELY TESTABLE SUPERCONDUCTOR JOINT

BACKGROUND OF THE INVENTION

The present invention relates to superconductor joints and more particularly to easily testable superconductor joints.

Superconductivity is the property of certain materials at cryogenic temperatures approaching absolute zero to carry currents without power dissipation. To establish the superconducting or persistent mode, an electromagnet wound with superconducting wire is cooled to superconducting temperature and energized with an external direct current power supply. Liquid helium is usually used to cool superconducting devices to about 4.2° K. When the desired current and magnetic field are established, a switch which joins the coil wire into a continuous loop is closed and the power supply is disconnected. If there are no resistive (non-superconducting) elements in the loop, the current and the magnetic field will remain constant indefinitely.

The switch consists simply of a section of wire heated to make it normal (resistive). Therefore, at least one wire-to-wire joint is needed for a magnet to complete the loop. For magnets with more than one coil, it is difficult or impossible to wind all coils with one continuous piece of wire, and several joints are required. For the persistent mode, such joints must not go normal when subjected to magnetic fields during operation of the magnet.

The method currently in use to determine the integrity of the superconducting electrical connections involves making test sample joints just prior to and immediately after making the magnet coil joints. The test joints are then evaluated by testing the joints in a superconducting environment (4.2° K.) for the values of persistent and quench current. If the samples made just prior to and immediately after the magnet connection prove to be satisfactory, it is then assumed that the magnet connection is also acceptable. The initial testing of the electrical connection themselves is not done until the entire magnet system is completely assembled and hermetically sealed in a cryostat. If a defective connection should be present, an intensive dismantling of the cryostat and considerable disassembly of the magnet system is required to perform the joint repairs. A 1.5 Tesla superconducting magnet can have over 35 superconducting joints.

It is an object of the present invention to provide an electrical coil connection for a superconducting magnet which can be checked for integrity and persistent behavior immediately after the connection is made and before further assembly of the magnet system.

It is a further object of the present invention to provide an electrical coil connection for a superconducting magnet which can be immediately checked for integrity and persistent behavior without requiring that the complete magnet be placed in a 4.2 K. environment.

SUMMARY OF THE INVENTION

In one aspect of the present invention an immediately testable superconductor joint is provided comprising a test loop of superconductor wire and two superconductor wires to be joined. The ends of the test loop and the ends of the two superconductor wires to be joined are coupled together in a single joint.

In another aspect of the present invention a method of assembling a superconducting magnet using an immediately testable superconductor joint comprises the steps of forming a test loop of superconductor wire. Next, two ends of the test loop and two ends of superconductor wire to be joined are joined in one joint. The test loop of superconductor wire joined by the joint is then tested for superconductivity. The test loop of superconductor wire is removed by cutting the portion of the loop not covered by the joint.

BRIEF DESCRIPTION OF THE DRAWING

While the specification concludes with claims particularly pointing out and distinctly claiming the present invention, objects and advantages of the invention can be more readily ascertained from the following description of a preferred embodiment when used in conjunction with the accompanying showing in which:

FIG. 1 is an isometric view of a superconducting electrical connection including a test loop in accordance with the present invention;

FIG. 2 is an isometric partially cutaway view of a test set-up for testing joints fabricated in accordance with the present invention;

FIG. 3 is a graph showing a typical test result of a superconductor joint including a test loop, with primary current and the resulting magnetic flux density shown on a common time scale; and FIG. 4 is a graph showing a typical test result of a superconductor joint with the test loop removed, with primary current and resulting magnetic flux density shown on a common time scale.

DETAILED DESCRIPTION OF THE INVENTION

Referring now to the drawing wherein the numerals indicate like elements throughout and particularly FIG. 1 thereof a superconductor joint is shown joining two superconductor leads 5 and 7 and joining in the same joint 9, the ends of a test loop 11 of superconductor wire. The superconductor wire can comprise a composite of a copper matrix embedded with niobium titanium alloy filaments. The joint can be made using any superconducting soldering technique such as the one described in copending application Ser. No. 567,117, filed Dec. 30, 1983, entitled "Superconducting Joint For Superconducting Wires and Coils and Method of Forming" and assigned to the instant assignee. Application Ser. No. 567,117 is hereby incorporated by reference.

The superconducting test loop when included in each individual electrical connection where superconductors are joined in a magnet system permits each joint to be tested immediately after forming the connection and it also permits retesting the joint at any future time in the life of a magnet system when the joint is made accessible.

Referring now to FIG. 2, to test a joint 9 which includes a test loop 11, the joint is placed in a dewar 13 containing liquid helium so that the test loop and solder connection are at 4.2° K. The test loop is mounted on a Textolite specimen holder 15 on the end of a ¼" diameter thin walled stainless steel tube 17 approximately four feet long, allowing insertion and withdrawal of test samples. Also in the dewar are a superconducting primary coil 21 and a Hall-probe gaussmeter 23 mounted coaxially with the primary coil and test loop. The gaussmeter is operated at substantially room temperature in order to maintain calibration, by mounting the gaussmeter in a stainless steel vessel 25 that is vacuum insulated from the liquid helium and immersed in a flow of several cubic feet per hour of dry nitrogen. The gaussmeter allows the determination of the loop current by measuring the magnetic field produced by that current. A resistance heater 27 is attached to the specimen holder 15 and in intimate contact with the test loop 11. The leads of the heater extend up the holder together with the magnet coil leads 5 and 7. Application of one to two amps to a 1.8 ohm resistance heater will drive the test loop normal in several seconds, and when the heater current is stopped, the loop will return to the superconducting state in several seconds.

Test results of a joint joining test loop with the ends a large loop of superconductor wire to simulate a magnet with the test loop in a 4.2° K. environment and the large loop of wire at room temperature is shown in FIG. 3. The excitation or primary coil is situated in the dewar at 4.2° K. The excitation current in the primary coil is ramped up, resulting in increasing flux detected by a gaussmeter. The test coil is then heated driving the test coil normal at time A, causing the opposing current in the test coil to cease. The current flowing in the primary coil, without the induced current of the test coil, causes the magnetic flux density to increase. With the excitation current constant, the heater current is stopped and the test loop again becomes superconductive. The excitation current is ramped down, inducing a current in the test loop and a current in the test loop persists even after the excitation current is reduced to zero. The gaussmeter measures flux density, which when divided by a loop to gaussmeter calibration constant in gauss/turns, gives the induced current. The gaussmeter is then monitored to check for current fall off.

FIG. 4 shows a graph of the results of a test of joint with the test loop removed by cutting and the large loop of wire simulating the magnet coil wound on a fixture and placed in the dewar. The excitation current in the primary coil is ramped up inducing a current in the loop on the test fixture. The magnetic flux density measured by the gaussmeter increases. Heat is applied to the loop on the test fixture driving it normal at time B, with the opposing current in the loop damping out, resulting in an increase in the magnetic flux density. The heat is removed and the loop again becomes superconducting. When the excitation current in the primary coil is ramped down to zero an opposing current flows in the loop. The magnetic flux density decreases as the primary current decreases and provides a measure of the test loop current when the primary current is zero.

As can be seen from the following table showing the results of several sample tests using a large loop of superconductor wire to simulate a magnet coil, the magnitude of the current values through the joint with the test loop removed differs only slightly from the test loop data, due to limitations of the maximum output of the test equipment power supply and the inability to achieve higher current levels. It is expected that the same quench current values of each of these joints can be obtained with or without the test loop present.

TABLE

| Sample | Joint Persistent Current in Amps Turn | |
|---|---|---|
| Airco Correction Coil Wire .0274" diameter | Test loop with large loop in room temp. ambient. | Large loop only with test loop removed. |
| 1 | 502* | 389** |
| 2 | 418 | 441** |
| 3 | 580 | 412** |
| 4 | 560 | 415** |

*Indicates quench current value. Other samples were not tested to their quench capability.
**Indicates maximum current capability of the test equipment power supply limited to these values.

The ends of the superconductor wires 5 and 6 of FIG. 1 when left at room temperature when the test loop is superconducting, appears as an infinite resistance compared to the test loop in the 4.2° K. environment, even when the ends 5 and 6 are formed in a loop. Persistent current carried in the joint is transmitted through the solder from one superconductor filament bundle to another. Therefore the test values obtained from the test loop are representative of the values in the magnet joint itself.

When the joints are placed in the magnet the test loop can be clipped. Alternatively, the test loop can be left and positioned orthogonal to the magnetic field to avoid inhomogeneities in the magnet field. If the loop is not removed and several feet of wire leading to and leaving from the joint are left unwound, the joint can be individually tested after magnet assembly, if desired, by again lowering the joint into a dewar and inducing a current therethrough.

The foregoing describes an electrical coil connection for a superconducting magnet which can be checked for integrity and persistent behavior immediately after the connection has been made and before further assembly of the magnet system.

While the invention has been particularly shown and described with reference to a preferred embodiment thereof, it will be obvious to those skilled in the art that various changes in form and details may be made without departing from the spirit and scope of the invention.

What is claimed is:

1. An immediately testable superconductor joint comprising:
    a test loop of superconductor wire;
    two superconductor wires to be joined; and
    a joint coupling the ends of the test loop and the ends of the two superconductor wires to be joined in a single joint.

2. The invention of claim 1 wherein said joint is a soldered joint.

3. A method of assembling a superconducting magnet using an immediately testable superconductor joint comprising the steps of:
    forming a test loop of superconductor wire;
    soldering the two ends of the loop and two ends of superconductor wire to be joined into one solder joint;
    testing the loop of superconducting wire joined by the solder joint for superconductivity, and
    removing the loop by cutting the portion of the loop not enclosed by the joint.

4. The method of claim 3 wherein said joint is a soldered joint.

* * * * *